United States Patent [19]
Kinoshita et al.

[11] Patent Number: 5,321,334
[45] Date of Patent: Jun. 14, 1994

[54] IMAGING DEVICE

[75] Inventors: Katsuyuki Kinoshita; Yoshinori Inagaki, both of Hamamatsu, Japan

[73] Assignee: Hamamatsu Photonics K.K., Hamamatsu, Japan

[21] Appl. No.: 123,041

[22] Filed: Sep. 20, 1993

Related U.S. Application Data

[63] Continuation of Ser. No. 616,939, Nov. 21, 1990, abandoned.

[30] Foreign Application Priority Data

Nov. 22, 1989 [JP] Japan ................................. 1-303572

[51] Int. Cl.$^5$ ............................................. H01J 31/26
[52] U.S. Cl. ................................... 313/366; 313/367; 313/368; 313/376; 313/377; 250/214 VT; 257/222; 257/231
[58] Field of Search ............... 313/366, 367, 368, 376, 313/377, 532, 379; 250/214 VT; 257/222, 231, 226

[56] References Cited

U.S. PATENT DOCUMENTS

| | | | |
|---|---|---|---|
| 4,687,922 | 8/1987 | Lemonier et al. | 250/213 |
| 4,698,544 | 10/1987 | Kinoshita et al. | 313/379 |
| 4,785,186 | 11/1988 | Street et al. | 250/370.14 |
| 4,902,927 | 2/1990 | Kinoshita | 313/376 |
| 4,977,584 | 12/1990 | Kohno et al. | 357/24 L R |

FOREIGN PATENT DOCUMENTS 0050673  4/1980  Japan ..................................... 313/367

OTHER PUBLICATIONS

T. Chikamura et al. "A Half Inch Size CCD Image Sensor Overlaid With a Hydrogenated Amorphous Silicon" International Electron Devices Meeting Technical Digest, San Francisco, Calif. (1984) pp. 552–555.

Douglas Currie "An Intensified Charge Coupled Device for Extremely Low Light Level Operation" University of Edinburgh: Technology and Application of Charge Coupled Devices: International Conference on Charge Coupled Devices, San Diego, California (1975) pp. 155–163.

*Primary Examiner*—Donald J. Yusko
*Assistant Examiner*—Nimesh D. Patel
*Attorney, Agent, or Firm*—Cushman, Darby & Cushman

[57] ABSTRACT

An imaging device comprising a vacuum vessel, an electron source arranged in the vessel and a solid-state image sensor arranged to receive signal electrons emitted from the electron source. The solid-state image sensor comprises a charge transferring device, picture element electrodes, an electron multiplier layer, and a surface electrode layer. The picture element electrodes are connected to the charge transferring device and cover the major part of this device. The surface electrode layer and the electron multiplier layer are stacked on the picture element electrodes. The surface electrode layer formed on the electron multiplier layer transmits the incident signal electrons to the electron multiplier layer.

20 Claims, 8 Drawing Sheets

--PRIOR ART--

5,321,334

IMAGING DEVICE

This is a continuation of application Ser. No. 07/616,939, filed on Nov. 21, 1990, which was abandoned upon the filing hereof.

BACKGROUND OF THE INVENTION

1. Field of the Invention

The present invention relates to an electron tube type imaging device.

2. Related Background Art

An imaging device is classified into a solid-state imaging device and an electron tube type imaging device. The solid-state imaging device has an essential disadvantage in that a sensitivity is insufficient when a size of picture element is reduced to improve a resolution power. In order to solve this problem, a laminated solid-state imaging device comprising a charge transferring device such as CCD laminated by a photo-conductive layer, in which an aperture ratio (a ratio of a light detection area to a surface area of the device) is increased has been developed, but an essential improvement of the sensitivity cannot be expected from the change of the surface area ratio of the device.

On the other hand, the electron tube type imaging device has a high sensitivity but it lacks stability and reliability. This will be described below in detail.

In the electron tube type imaging device, an incident light is first photo-electrically converted and a resulting electronic image is converted to a fluorescent image so that an image is picked up optically, or the image is picked up as an electronic image. In such an imaging device, a solid-state imaging device such as one shown in FIG. 5 may be used. As shown, an n-type layer 12 which serves as an electron charge accumulation area and an n-type layer 13 which serves as an electron charge transfer area are formed on a p-type substrate 11, and a top side thereof is covered with an insulation layer 14 such as $SiO_2$. A transfer gate 15 and a shielding film 16 are formed in the electron charge transfer area of the insulation layer 14. In such an imaging device, when a signal (electrons) is applied as shown by an arrow, electron-hole pairs in the amount corresponding to an input energy are generated in the vicinity of a p-n junction of the p-type substrate 11 and the n-type layer 12, and the multiplied electrons (signal electrons) are transferred and read by the electron charge transfer area comprising the n-type layer 13 and the transfer gate 15.

This type of solid-state imaging device in which the electrons are directed to the front surface of the substrate may be called a front surface input type device while a device in which the electrons are directed to a back surface of the substrate may be called a back surface input type device. In the back surface input type device, the p-type substrate 11 is thinly machined as shown by a broken line L in FIG. 5. In this case, again, the input electrons are multiplied in the vicinity of the p-n junction of the p-type substrate 11 and the n-type layer 12, or the electrons applied to the n-type layer 12 may be stored in the n-type layer 12 and read into the n-type layer 13.

In the front-face bombardment type device, the insulation layer 14 is charge negatively by the input electrons. The input electrons apt to damage the interface of the insulation layer 14 and the n-type layer 12 and the sensitivity is lowered by a dark current. Further, since not only the charge accumulation area but also the charge transfer area are formed on the surface of the p-type substrate 11, an effective area to accept the input electrons, that is, a numerical aperture is reduced.

On the other hand, in the rear-face bombardment type device, the charging of the insulation layer 14 and the damage of the interface of the n-type layer 12 and the insulation layer 14 can be prevented but a structural defect increases significantly. Namely, in order to attain a sufficient resolution power by the rear surface input type device, it is necessary to make the thickness of the p-type substrate 11 to around 10 $\mu$m. This makes the manufacturing of the device and setting it on the electron tube very difficult.

As a result, the prior art device which mounts such a solid-state imaging device in the vacuum tube not only lacks the structural stability but also has insufficient sensitivity and noise characteristics as well as life expectancy and reliability.

Thus, the solid-state imaging device as well as the electron tube type imaging device have the foregoing inherent problems.

SUMMARY OF THE INVENTION

It is an object of the present invention to provide an electron tube type imaging device which has a large numerical aperture in substance, is structurally stable and has high sensitivity and high signal noise ratio, by using structurally strong solid-state imaging means.

It is another object of the present invention to provide an imaging device comprising a vacuum vessel, an electron source arranged in said vacuum vessel and a solid-state imaging means arranged to receive electrons emitted from the electron source on a surface thereof. The solid-state imaging means comprises a semiconductor substrate having a plurality of charge accumulation means for accumulating signal charges by the emitted electrons; a plurality of charge output means for outputting the accumulated charges, formed thereon; an insulation layer formed on the semiconductor substrate; picture element electrodes formed on the insulation layer, each covering the corresponding charge accumulation means and a portion of the corresponding charge transfer area; connecting elements, each buried in the insulation layer and connecting the corresponding picture element electrode to the corresponding charge accumulation means; an electron multiplier layer formed on the picture element electrodes to multiply the input electrons; and a surface electrode layer formed on the electron multiplier layer to transmit the input electron therethrough.

In accordance with the above imaging device, since the solid-state imaging means is arranged in the vacuum vessel to form an electronic image and the picture element electrodes are arranged in the solid-state imaging means to cover the electron accumulation means and the charge transfer means, the numerical aperture may be increased in substance. Further, since it is not necessary to make the substrate thin, a structurally strong device is attained.

It is another object of the present invention to provide an imaging device comprising a vacuum vessel, an electron source arranged in the vacuum vessel, a laminated solid-state imaging device having a solid-state imaging device formed on a substrate and a thin film layer formed on the solid-state imaging device, wherein the thin film layer includes a surface electrode layer, to which electrons emitted from the electron source are applied, and an electron multiplier layer. The surface electrode layer transmits the input electrons therethrough, and the electron multiplier layer multiplies the transmitted electrons, in accordance with the input energy, and transfers the multiplied signal charge to the solid-state imaging device. The solid-state imaging device comprises a plurality of picture element electrodes for receiving the signal charges from the electron multiplier layer, a plurality of charge accumulation means for accumulating the signal charges from the picture element electrodes, and a charge output means for outputting the signal charges accumulated in the charge accumulation means, wherein the picture element electrodes cover a portion of the charge output means and are isolated from the charge output means.

In accordance with the above imaging device, since the laminated solid-state imaging device having the electron multiplier layer is arranged in the vacuum vessel to form an electronic image, the numerical aperture may be increased in substance and the sensitivity is significantly improved due to the electron multiplication.

It is another object of the present invention to provide an imaging device in which the electron source has a photoelectric cathode formed in an inner surface of a plate of the vacuum vessel.

It is another object of the present invention to provide an imaging device in which a layer for preventing the injection of a current from the surface electrode layer to the electron multiplier layer is formed between the electron multiplier layer and the surface electrode layer.

It is another object of the present invention to provide an imaging device in which the surface electrode layer is made of a material having a low reflectance to the input electrons.

It is another object of the present invention to provide an imaging device in which the surface electrode layer is made of a material having a low reflectance to the input light.

the present invention will become more fully understood from the detailed description, given hereinbelow, and the accompanying drawings, which are given by way of illustration only and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Figure 1A:
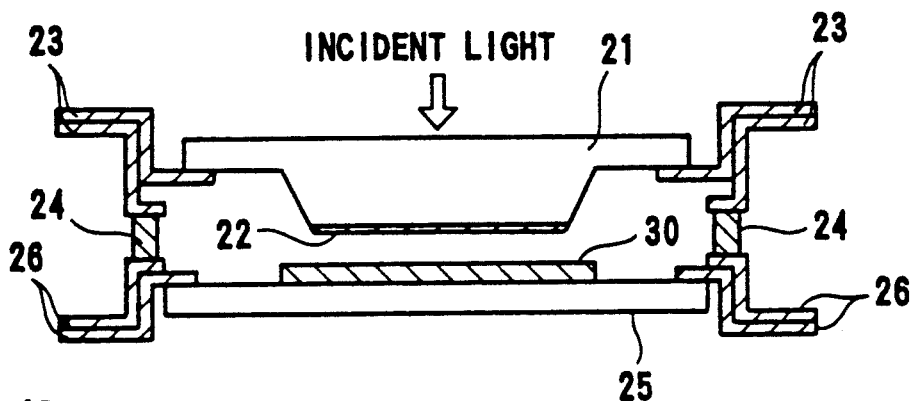
FIG. 1A shows a construction of an imaging device in accordance with one embodiment of the present invention.

As shown in FIG. 1A, a photoelectric cathode 22 is formed on an inner surface of a glass plate 21 which is fixed to one side of a side tube 24 through a mounting member 23. A supporting substrate 25, on which a laminated solid-state device 30 is mounted, is fixed to the other side of the side wall or tube 24 by a mounting member 26. Thus, a vacuum vessel comprising the plate 21, mounting member 23, side tube 24, supporting substrate 25 and mounting member 26 is constructed. The photoelectric cathode 22 and the laminated solid-state imaging device 30 are closely arranged to each other with a spacing of several hundreds of $\mu$m to several mm, and a high voltage (negative) of several kV is applied to the photoelectric cathode 22.

Figure 1B:
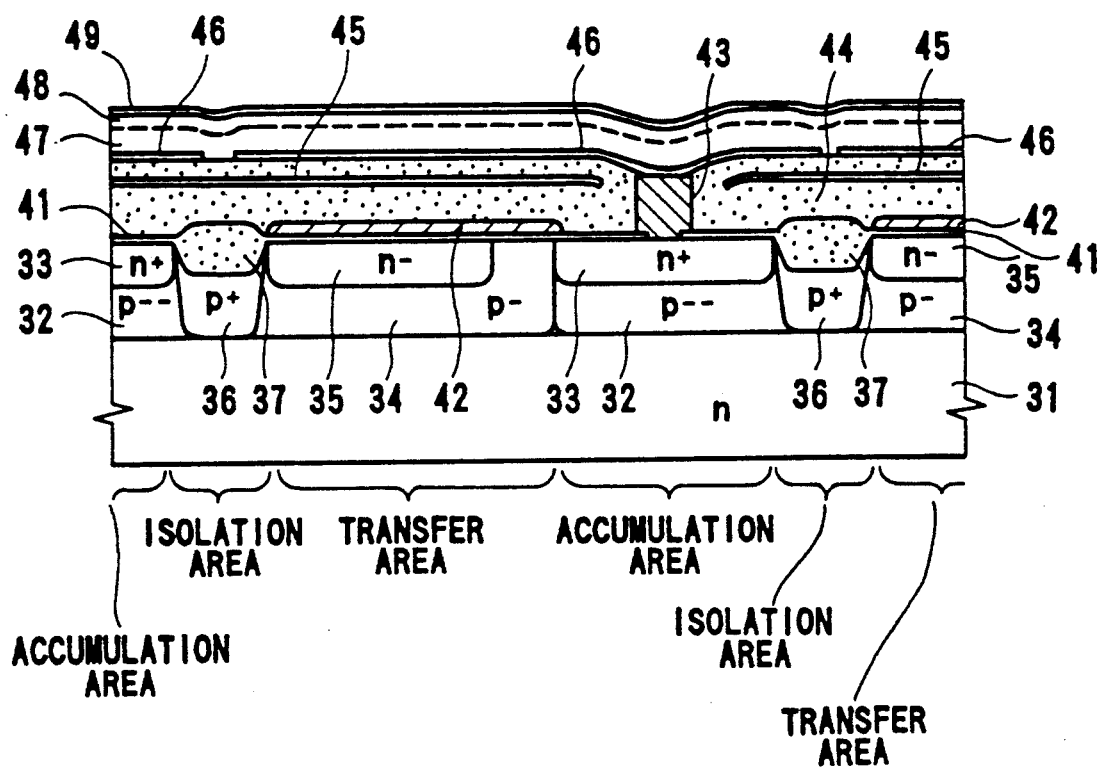
FIG. 1B shows a laminated solid-state imaging device in incorporated in the device of FIG. 1A.

The solid-state device utilized for constructing the laminated solid-state device may be of an appropriate type known to those people skilled in the art. In the following description, a CCD type device is used. A detailed construction of the laminated solid-state device 30 is shown in FIG. 1B. An $n^+$ type layer 33 is formed in a $p^-$ type well 32, which is formed in an n type substrate, together forming a p-n photo-diode which serves as a charge accumulation area. An $n^-$ type layer 35 is formed in a $p^-$ type well 34, which is formed adjacent to the $p^-$ type well 32, together forming a charge transfer area. Picture elements are electrically isolated by a $p^+$ type layer 36 and an $SiO_2$ layer 37 formed thereon by a LOCOS (local oxidation) method.

A thin $SiO_2$ film 41 is formed on the substrate thus formed, and a transfer gate 42 made of poly-silicon is formed in the charge transfer area on the $SiO_2$ film 41. In the $SiO_2$ film 41, an aperture is formed on the $n^+$ type layer 33, and connecting electrodes 43 are formed thereon. The connecting electrodes 43 may be made of poly-silicon, and are buried in a thin $SiO_2$ layer 44. A shielding film 45 made of aluminum is embedded in the $SiO_2$ layer 44, and picture element electrodes 46 made of poly-silicon are formed on the $SiO_2$ layer 44. The picture element electrodes 46 are connected to the corresponding connecting electrodes 43. The picture element electrodes 46 are wide enough to cover not only the charge accumulation area but also the charge transfer area.

An i type amorphous Si layer 47 and a p type amorphous $Si_{1-x}C_x$ layer 48 are formed on the picture element electrode 46, and a thin surface electrode layer 49 made of beryllium is formed thereon. The amorphous Si layer 47 generates electron-hole pairs by the input or incident electrons to serve as an electron multiplier layer which multiplies the signal electrons in accordance with the input or incident energy, and the amorphous $Si_{1-x}C_x$ layer 48 serves as an injection suppression layer to suppress the injection of current from the surface electrode layer 49.

An operation of the device in the embodiment of FIG. 1A is now explained. In the device of FIG. 1A, when the signal light is directed to the plate 21, it is photoelectrically converted by the photoelectric cathode 22 and electrons are emitted, which are applied to the laminated solid-state imaging device 30. Referring back to FIG. 2, the electrons applied to the laminated solid-state imaging device 30 pass through the surface electrode layer 49 of several hundreds of Å thick and are injected into the amorphous Si layer 47 through the amorphous $Si_{1-x}C_x$ layer 48, and the electrons are multiplied thereby. A biasing voltage (e.g. several volts) is applied across the surface electrode layer 49 and the picture element electrode 46. Accordingly, the multiplied electrons flow into the picture element electrode 46 and are supplied to the n+ type layer 33 through the connecting electrode 43. Since the picture element electrode 46 is wide enough to cover the charge transfer area, the numerical aperture for the input or incident electrons may be large. Further, since the amorphous $Si_{1-x}C_x$ layer 48 which serves as the injection suppression layer is formed between the amorphous Si layer 47, which serves as the electron multiplier layer, and the surface electrode layer 49, the dark current is reduce and reduction of the signal-noise ratio and the sensitivity is prevented.

The signal charge stored in the photo-diode comprising the p− type well 32 and the n+ type layer 33 is sent to the n− type layer 35 in synchronism with the clock signal applied to the transfer gate 42, and it is further sent to the output area. The device of the present embodiment is the front surface input type, but the input or incident electrons do not reach the substrate, so that the damage of the device by the input energy is minimized. Since it is not necessary to make the substrate thin, it is structurally stable.

In the CCD (Charge-Coupled Device) type solid-state imaging device of the present embodiment, the transfer area is constructed by the p-n junction comprising the transfer gate 42, the p− type well 34 and the n− type layer. Further, the signal charge is transferred in the substrate, although an imaging device having another transferring structure may be used. For example, the above operation also may be realized by the use of other device having a similar structure such as a CPD (Charge Priming Device) type solid-state imaging device, BBD (Bucket-Brigade Device) type solid-state device or the like to which a signal transfer method may be applied. Further, it also may be realized by the use of a device to which a X-Y address method may be applied, instead of the charge transfer reading-out method. For example an imaging device having a structure such as those of MOS (Metal-Oxide Semiconductor), PCD (Plasma-Coupled Device), CID (Charge-Injection Device), SIT (Static Induction Transistor), CPD or the like may be used to attain the same operation. Additionally the operation also may be realized by the use of an AMI (amplified MOS intelligent imager).

Figure 1C:
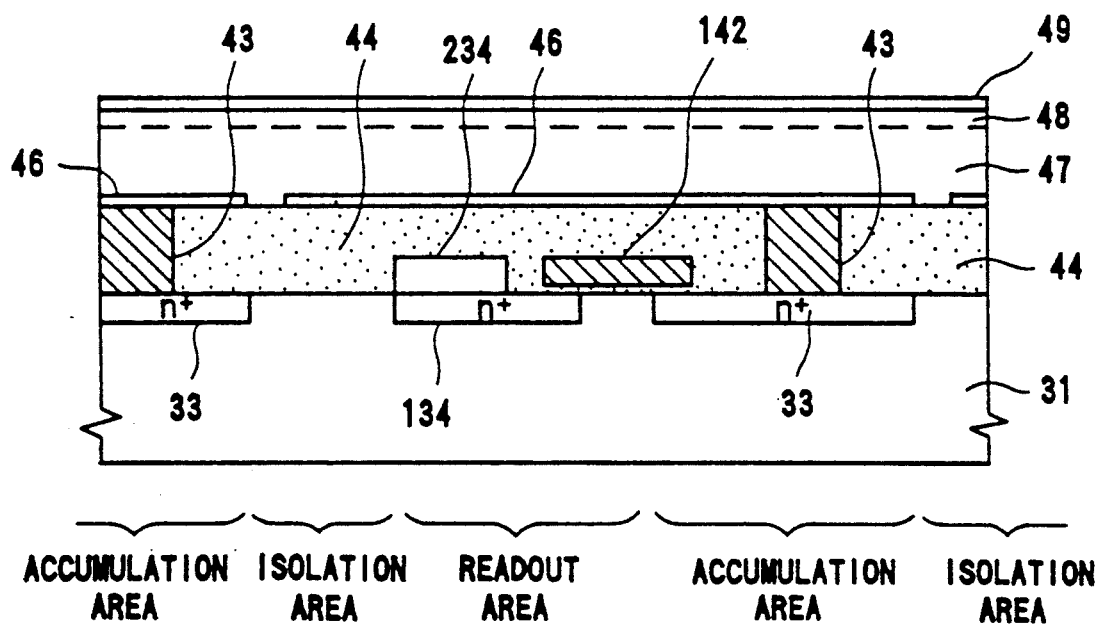
FIG. 1C shows a modification of the device of FIG. 1B.

FIG. 1C shows a modification of the laminated solid-state device 30 shown in FIG. 1B. In the laminated solid-state device shown in FIG. 1C, the X-Y address method using a MOS structure is employed as a signal outputting method. An explanation relating to the same portion as the laminated solid-state device is omitted by assigning the same references as in FIG. 18. The multiplied electrons from the picture element electrode 46 are accumulated in the n+type layer 33 formed in a p type substrate 31. In the p type substrate, another n+type layer 134 adjacent to the n+type layer 33 is also formed. Above both the n+type layers 33 and 134, a gate electrode 142 made of poly-silicon is formed through the thin $SiO_2$ layer 44. Above the n+type layer drain 134, a vertical output lead 234 made of aluminum is formed. Accordingly, MOS-FET switching device having a source and a drain of the n+type layers 33 and 134, respectively and a gate electrode 142 is formed. The gate electrode 142 is connected to an external vertical scanner and a voltage signal is applied thereto in a predetermined timing. The multiplied electrons accumulated in the n+layer 33 is sent to the output area through the vertical lead 234 in synchronism with the voltage signal applied to the gate electrode 142.

Figure 2A:
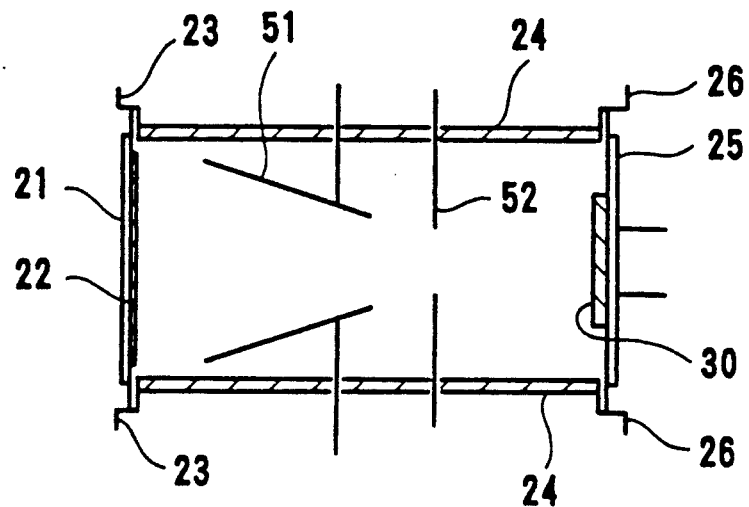
FIG. 2A shows a application of the device of FIG. 1A.
Figure 2B:
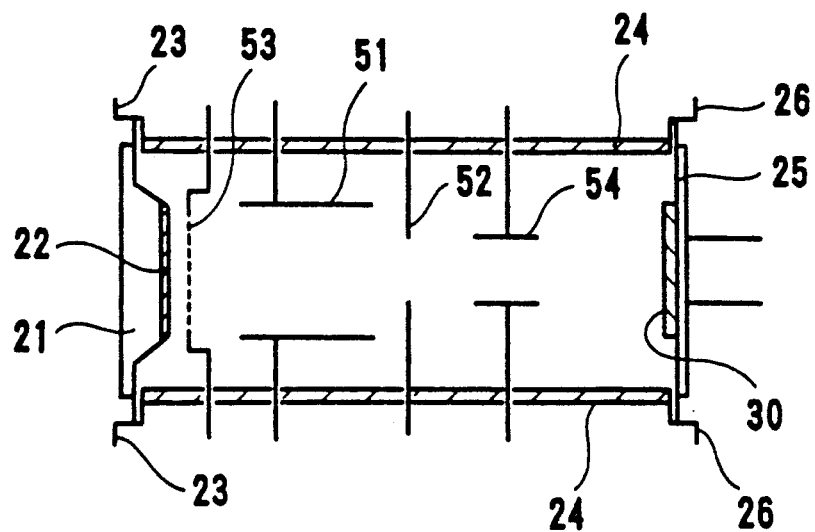
FIG. 2B shows an another application of the device of FIG. 1A.

The present invention is not limited to the imaging device having the photoelectric cathode and the laminated solid-state imaging device arranged closely to each other as shown in FIG. 1, but it may also be applied to an electron tube having an image focusing unit as shown in FIG. 2. FIG. 2A shows an application to an II (image intensifier) tube, and FIG. 2B shows an application to a streak tube. As shown in FIG. 2A, the plate 21 is fixed to one side of the side tube 24 through the mounting member 23, and the photoelectric cathode 22 is formed in the inner surface of the plate 21. The supporting substrate 25 is fixed to the other side of the side tube 24 through the mounting member 26, and the laminated solid-state imaging device 30 is fixed to the inner surface of the supporting substrate 25. A focusing electrode 51 and an anode electrode 52 are arranged in the vacuum vessel. Thus, the electrons emitted from the photoelectric cathode 22 by the incident light to the plate 21 are focused by the focusing electrode 51 and applied to the laminated solid-state imaging device 30. The laminated solid-state imaging device 30 is of the same construction as that shown in FIG. 1B. The streak tube shown in FIG. 2B differs from the II tube shown in FIG. 2A in that a grid electrode 53 and a sweep electrode 54 are formed in the vacuum vessel. In this case, again, the laminated solid-state device 30 shown in FIG. 1B is used.

As seen from the above description, a feature of the present invention resides in the amplified imaging of the two-dimensional image. This technique may also be applied to the one-dimensional image as it is.

Various modifications of the imaging device of the present invention may be made. As for the laminated solid-state imaging device which is a principal part thereof, the following modification may be made to attain better characteristics.

Figure 3A:
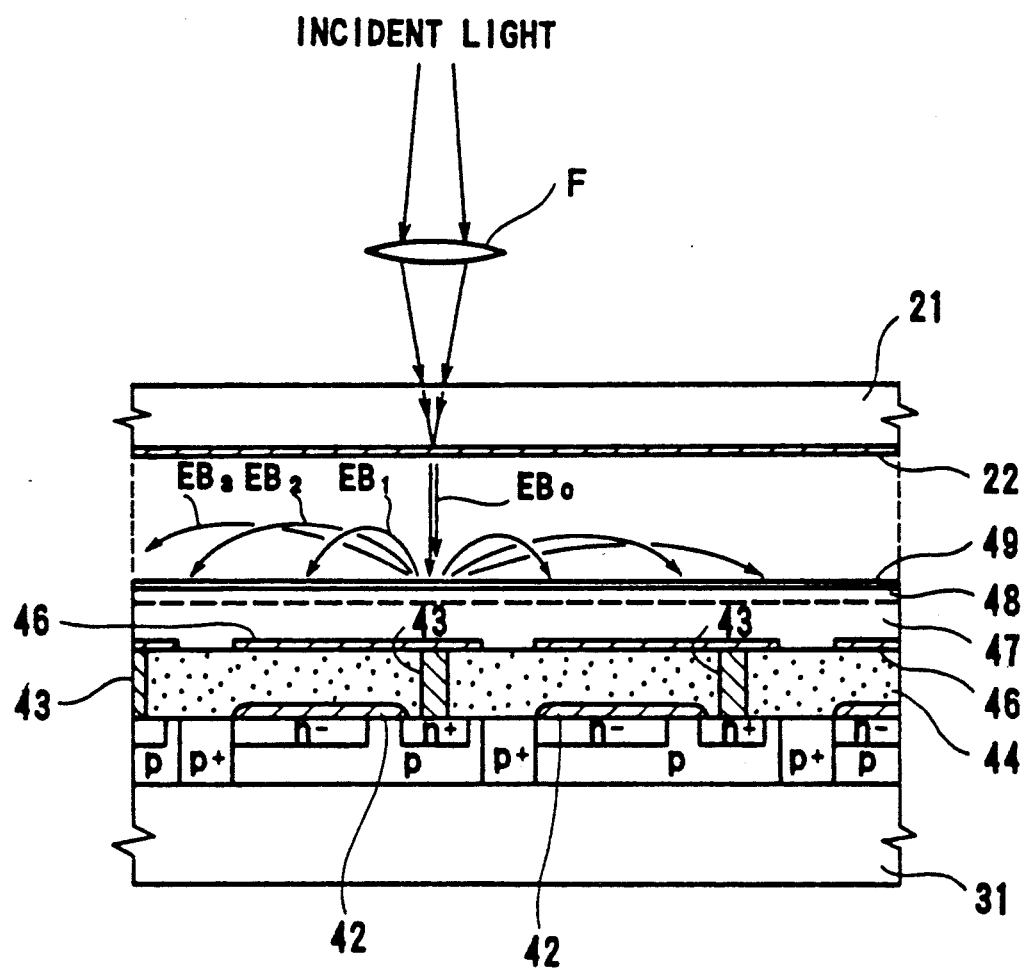
FIG. 3A shows an another modification of the laminated solid-state imaging device.
Figure 3B:
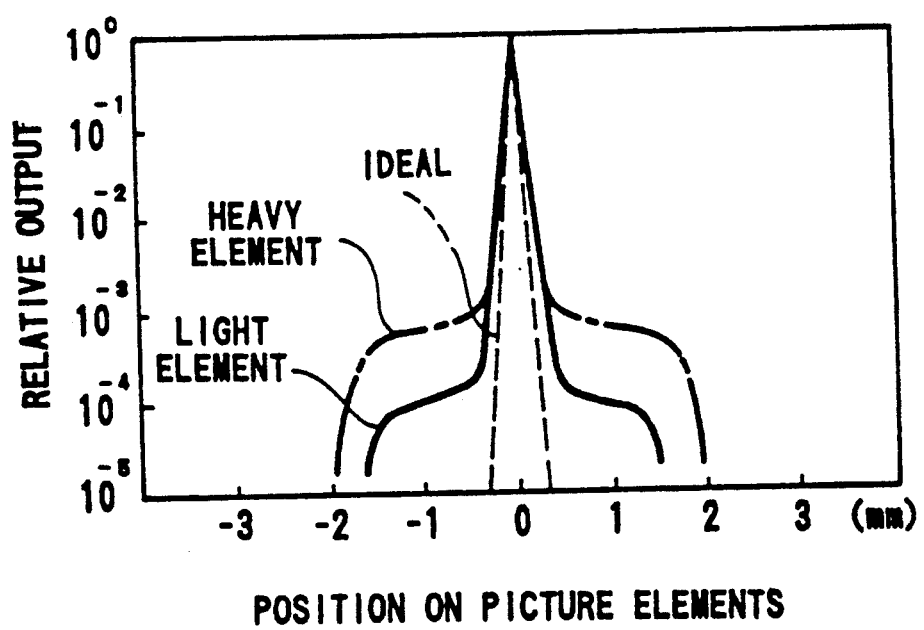
FIG. 3B shows an output distribution of the device of FIG. 3A.

In a first modification, as in FIG. 3A, the surface electrode 49 is made of a light element to reduce a so-called background. When a signal light becomes incident on the photoelectric cathode 22 through a lens F, an electron EBo is emitted and impinges on the surface electrode layer 49. Where the surface electrode layer 49 is made of a heavy element such as molybdenum (Mo), silver (Ag) or gold (An), a portion of the incident electrons are reflected as shown by EB1, EB2 and EB3 and they are again directed to the surface electrode layer 49 in an expanded area. When such scattering of the signal charge occurs, the background increases, which leads to a crosstalk. A broken line in FIG. 3B shows an ideal state, and a chain line shows a state when a heavy element is used.

Where a light element such as beryllium (Be), carbon (C) or aluminum (Al) is used as the material of the surface electrode layer 49 in order to overcome the above problem, the reflection of the input electrons as shown in FIG. 3A is reduced. As a result, the output distribution is that shown in FIG. 3B so that the background is reduced to approximately one quarter. This effect is valid not only to a light element having metallic luster but also to a porous light element.

Figure 4A:
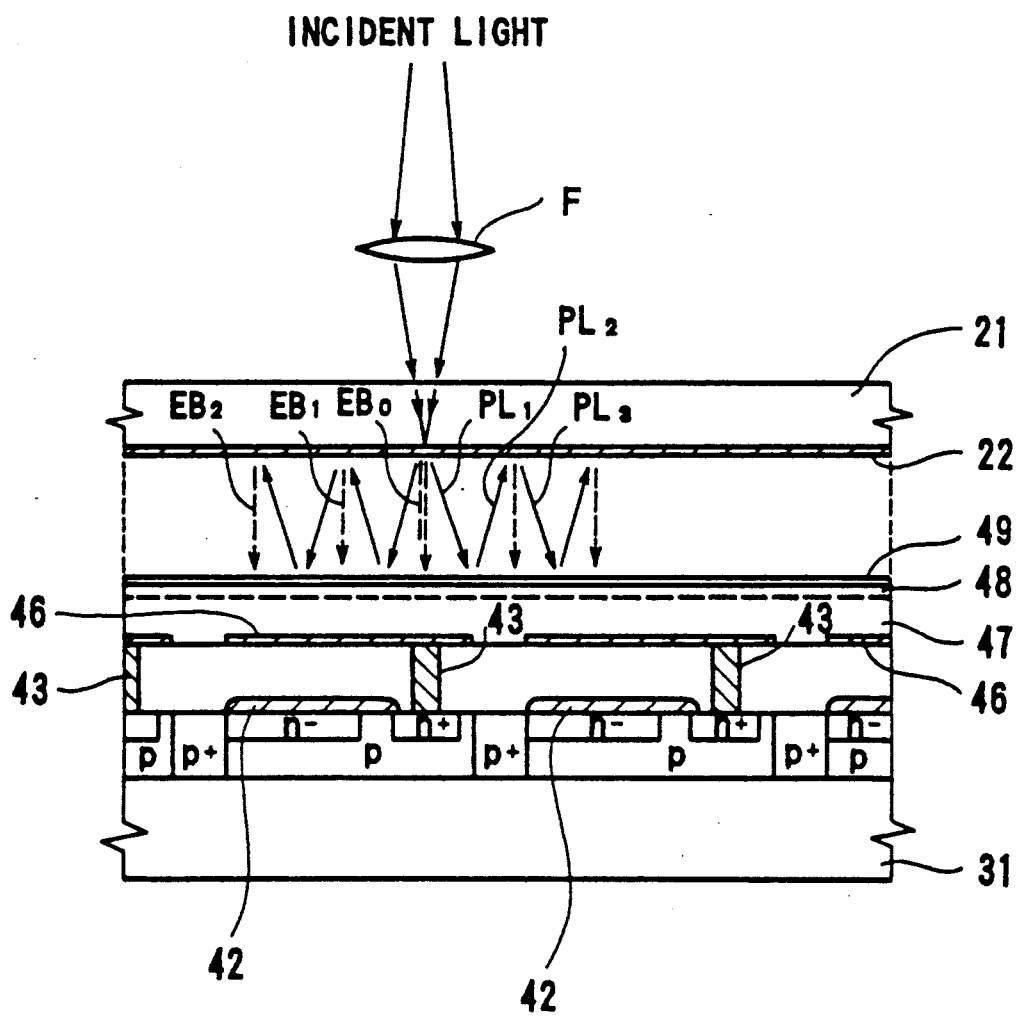
FIG. 4A shows another modification of the laminated solid-state imaging device.
Figure 4B:
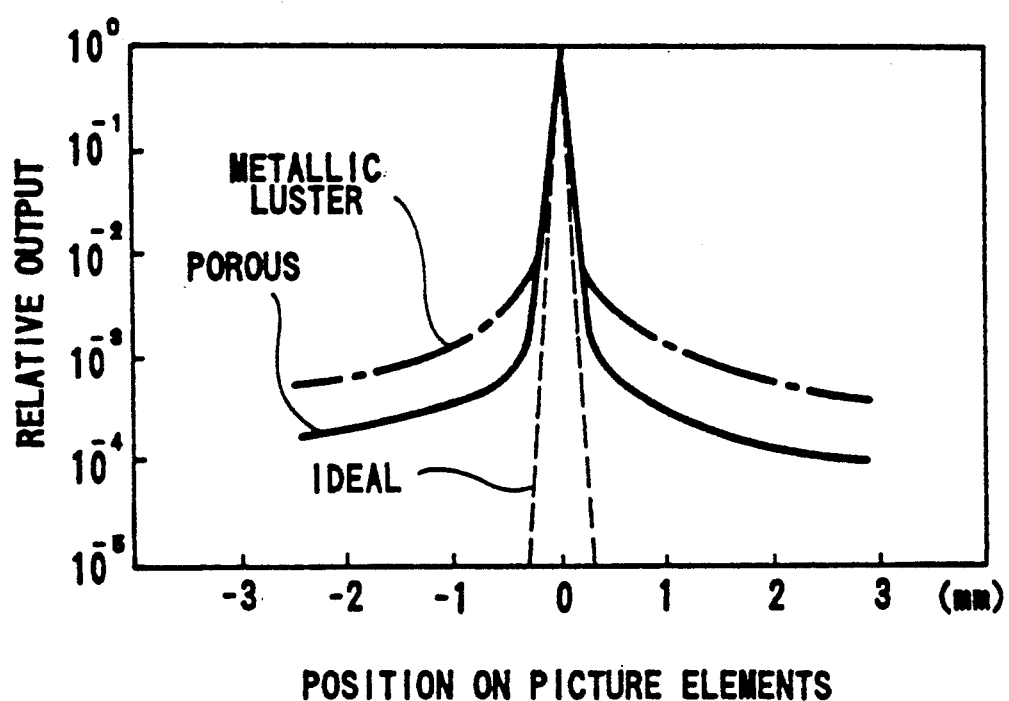
FIG. 4B shows an output distribution of the device of FIG. 4A.
Figure 5:
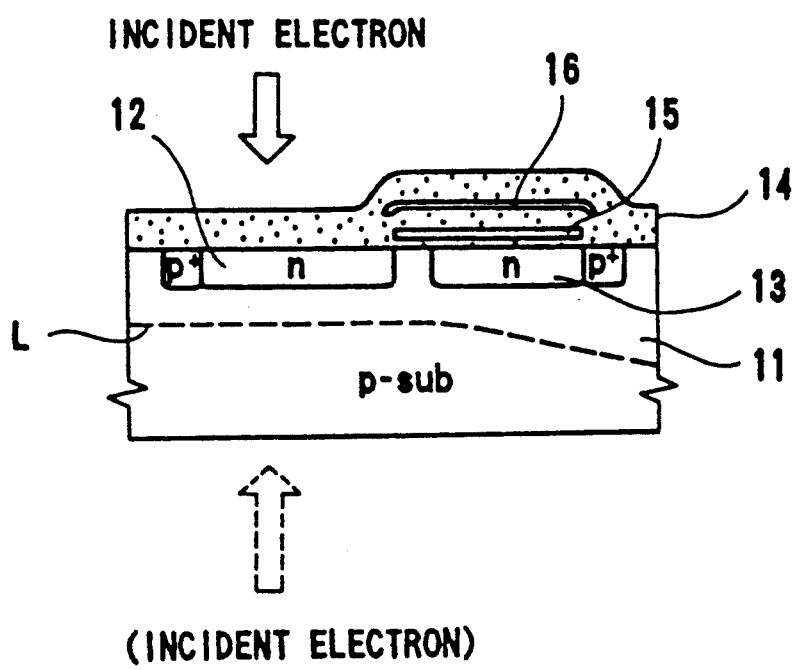
FIG. 5 shows a prior art solid-state imaging device.

In a second modification, the surface electrode layer 49 is a porous or a complex layer to reduce the background. As shown in FIG. 4A, when the signal light is applied to the photoelectric cathode 22 through the lens F, the electron EBo is emitted and the signal light is scattered. If the surface electrode layer 49 has metallic luster, the scattered light PL1 is reflected by the surface electrode layer 49 and the reflected light PL2 is again directed to the photoelectric cathode 22. The light PL3 reflected by the photoelectric cathode 22 is reflected by the surface electrode layer 49 and it is again directed to the photoelectric cathode 22. Through such multi-reflection, the electrons EB1, EB2 are emitted from the photoelectric cathode 22 each time, which increases the background. As a result, the output distribution is that shown by an alternate long and short dash line in FIG. 4B and the cross-talk easily occurs.

Where the surface electrode layer 49 is porous, the light reflection is reduced and the output distribution is that shown by a solid line in FIG. 4B. The porous film may be formed by vapor-depositing beryllium or aluminum in inert gas. In this manner, the background may be reduced to less than one third. A similar effect may be attained by forming a thin carbon film on the film having the metallic luster to form a composite film.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. An imaging device comprising:
   a vacuum vessel,
   an electron source arranged in said vacuum vessel for emitting electrons toward an inside of said vacuum vessel in response to an incident light; and
   a solid-state imaging means arranged in said vessel to receive electrons emitted from said electron source on a surface thereof,
   said solid-state imaging device comprising:
   a semiconductor substrate having: a) a plurality of charge accumulation means for accumulating signal charges generated by said emitted electrons and b) a plurality of charge transfer and output means for transferring and outputting said accumulated charges from one charge accumulation means to another charge accumulation means adjacent to said one charge accumulation means, said charge accumulation means and said charge output means being formed integrally with said substrate;
   an insulation layer formed on said charge accumulation means and said charge transfer and output means,
   picture element electrodes, formed on said insulation layer, each corresponding to at least one charge accumulation means and at least one charge transfer and output means and completely covering said at least one charge accumulation means and said at least one charge transfer and output means, for preventing the emitted electrons from entering said at least one charge accumulation means and said at least one charge transfer and output means,
   connecting elements, each buried in said insulation layer connecting said corresponding picture element electrode to said corresponding charge accumulation means,
   an electron multiplier layer formed on said picture element electrodes to multiply the input electrons; and
   a surface electrode layer formed on said electron multiplier layer to transmit the input electrons therethrough.

2. An imaging device according to claim 1, wherein said electron source has a photoelectric cathode formed in an inner surface of a light-receiving plate of said vacuum vessel.

3. An imaging device according to claim 1, wherein a layer for preventing the injection of current from said surface electrode layer to said electron multiplier layer is formed between said electron multiplier layer and said surface electrode layer.

4. An imaging device according to claim 1, wherein said surface electrode layer is made of a material having a low reflectance to the input electrons.

5. An imaging device according to claim 4, wherein said surface electrode layer is made of any element selected from Be, C or Al.

6. An imaging device according to claim 1, wherein said surface electrode layer is made of a material having a low reflectance to the input light.

7. An imaging device according to claim 6, wherein said surface electrode layer is porous.

8. An imaging device according to claim 3, wherein said surface electrode layer is made of a material having a low reflectance to the input electrons.

9. An imaging device according to claim 8, wherein said surface electrode layer is made of any element selected from Be, C or Al.

10. An imaging device according to claim 3, wherein said surface electrode layer is made of a material having a low reflectance to the input light.

11. An imaging device according to claim 10, wherein said surface electrode layer is porous.

12. An imaging device according to claim 8, wherein said surface electrode layer is made of a material having a low reflectance to the input light.

13. An imaging device according to claim 12, wherein said surface electrode layer is porous.

14. An imaging device according to claim 1, wherein said output means have charge transfer areas and the charge accumulated in said charge accumulation means is output by the transfer of the charge.

15. An imaging device according to claim 1, wherein said outputs means independently output the charge accumulated in said charge accumulation means in response to an external signal.

16. An imaging device comprising:
    a vacuum vessel,
    an electron source arranged in said vacuum vessel for emitting electrons toward an inside of said vacuum vessel in response to an incident light; and
    a solid-state imaging means arranged in said vacuum vessel to receive electrons emitted from said electron source on a surface thereof,
    said solid-state imaging device comprising:
    a semiconductor substrate;
    a plurality of charge accumulation means formed on said semiconductor substrate, for accumulating signal charges generated by said emitted electrons;
    a plurality of charge transfer and output means formed on said semiconductor substrate, for outputting said accumulated charges, an insulation layer formed on said charge accumulation means and on said charge transfer and output means, picture element electrodes formed on said insulation layer, each completely covering a corresponding charge transfer and output means, to prevent the emitted electrons from entering said corresponding charge output means;

connecting elements, each buried in said insulation layer connecting said corresponding picture element electrode to said corresponding charge accumulation means, an electron multiplier layer formed on said picture element electrodes to multiply the input electrons; and a surface electrode layer formed on said electron multiplier layer to transmit the input electrons therethrough.

17. A device as in claim 1 wherein each said charge accumulating means is between two charge transfer and output means and further comprising isolation areas for isolating said each charge accumulating means from one of said two charge transfer and output means.

18. A device as in claim 17 wherein each picture element electrode means extends from a first location over one of said isolation areas to a second location over another of said isolation areas, and completely covers all locations between said first location and said second location.

19. A device as in claim 16 wherein each said charge accumulating means is between two charge transfer and output means and further comprising isolation areas for isolating said each charge accumulating means from one of said two charge transfer and output means.

20. A device as in claim 19 wherein each picture element electrode means extends from a first location over one of said isolation areas to a second location over another of said isolation areas, and completely covers all locations between said first location and said second location.

* * * * *